(12) United States Patent
Muraoka

(10) Patent No.: US 9,054,139 B2
(45) Date of Patent: Jun. 9, 2015

(54) CHEMICAL LIQUID SUPPLYING APPARATUS

(75) Inventor: Hiroyuki Muraoka, Tokyo (JP)

(73) Assignee: Koganei Corporation, Tokyo (JP)

( * ) Notice: Subject to any disclaimer, the term of this patent is extended or adjusted under 35 U.S.C. 154(b) by 255 days.

(21) Appl. No.: 13/808,432

(22) PCT Filed: Jan. 31, 2011

(86) PCT No.: PCT/JP2011/051921
§ 371 (c)(1),
(2), (4) Date: Jan. 4, 2013

(87) PCT Pub. No.: WO2012/005015
PCT Pub. Date: Jan. 12, 2012

(65) Prior Publication Data
US 2013/0101444 A1 Apr. 25, 2013

(30) Foreign Application Priority Data
Jul. 9, 2010 (JP) .................. 2010-156339

(51) Int. Cl.
*F04B 43/08* (2006.01)
*H01L 21/67* (2006.01)
*F04B 43/107* (2006.01)

(52) U.S. Cl.
CPC .......... *H01L 21/67023* (2013.01); *F04B 43/08* (2013.01); *F04B 43/107* (2013.01)

(58) Field of Classification Search
CPC .. F04B 43/107; F04B 43/084; F04B 43/0063; F04B 43/08; F04B 45/02; F04B 53/02; H01L 21/67023
USPC .......................................... 417/390, 472, 473
See application file for complete search history.

(56) References Cited

U.S. PATENT DOCUMENTS 2,897,650 A * 8/1959 Carlson, Jr. et al. ............ 60/326
3,338,170 A * 8/1967 Swartz .............................. 417/21
(Continued)

FOREIGN PATENT DOCUMENTS

DE 2910328 A1 9/1980
JP 2008128059 A 6/2008
(Continued)

OTHER PUBLICATIONS

International search report for PCT/JP2011/051921 dated Apr. 6, 2011.

*Primary Examiner* — Devon Kramer
*Assistant Examiner* — Nathan Zollinger
(74) *Attorney, Agent, or Firm* — McCormick, Paulding & Huber LLP

(57) ABSTRACT

In a chemical liquid supplying apparatus 10a for discharging chemical liquid by expanding and contracting a pump chamber 16 which communicates with a chemical liquid inlet 21 and a chemical liquid outlet 22, the apparatus has a cylinder 12 in which a piston 31 is accommodated and reciprocally movable in an axial direction. A bellows 35 which is elastically deformable in the axial direction is mounted to a cylinder hole 30 between the tip of a connection rod 34 and the cylinder 12. On the inside of the bellows 35, an expanding/contracting chamber 37 is formed as a compartment between the connection rod 34 and the bellows 35, a pressure chamber 38 which communicates with the expanding/contracting chamber 37 is provided on the tip side of the piston 31, and an incompressible indirect medium 39 is enclosed in the expanding/contracting chamber 37 and the pressure chamber 38. The average effective diameter $D2$ of this bellows 35 is set so as to be smaller than the outer diameter $D1$ of a sliding surface 32 of the piston 31.

9 Claims, 3 Drawing Sheets

(56) References Cited

U.S. PATENT DOCUMENTS

| | | | |
|---|---|---|---|
| 4,080,107 A * | 3/1978 | Ferrentino | 417/53 |
| 4,634,430 A * | 1/1987 | Polaschegg | 604/141 |
| 4,655,690 A * | 4/1987 | Boedecker et al. | 417/53 |
| 7,841,842 B2 * | 11/2010 | Yajima | 417/394 |
| 8,025,488 B2 * | 9/2011 | Sellas et al. | 417/394 |
| 8,033,801 B2 * | 10/2011 | Kato et al. | 417/472 |
| 2008/0115662 A1 | 5/2008 | Yajima | |
| 2008/0138214 A1 * | 6/2008 | Yajima | 417/246 |
| 2008/0145248 A1 | 6/2008 | Kato et al. | |
| 2009/0142205 A1 * | 6/2009 | Yajima | 417/375 |

FOREIGN PATENT DOCUMENTS

| | | |
|---|---|---|
| JP | 2008128178 A | 6/2008 |
| JP | 2008133800 A | 6/2008 |
| JP | 2009138520 A * | 6/2009 |

* cited by examiner

CHEMICAL LIQUID SUPPLYING APPARATUS

TECHNICAL FIELD

The present invention relates to a chemical liquid supplying apparatus which is used for discharging a specific amount of chemical liquid such as photoresist liquid.

BACKGROUND ART

On a surface of a semiconductor wafer, a liquid crystal glass substrate, or the like, a fine circuit pattern is formed in a photolithography process and an etching process, and in the photolithography process, a chemical liquid supplying apparatus for applying chemical liquid such as photoresist liquid to a surface of a wafer or a glass substrate is used. As the chemical liquid supplying apparatus, for example, as disclosed in Patent Document 1, a syringe type apparatus having a piston which is accommodated in a cylinder and reciprocally movable, and a pump chamber which is expanded/contracted by reciprocal movements of the piston. At the time of expansion of this pump chamber, chemical liquid is sucked into the pump chamber from a chemical liquid supply source, and at the time of contraction of the pump chamber, the chemical liquid is discharged from the pump chamber so that the chemical liquid is applied to an object to be coated, such as a wafer, from an application nozzle provided at the tip of an discharge side passage.

And as another example, Patent Document 2 discloses a bellows type chemical liquid supplying apparatus in which a pump chamber is expanded/contracted by extension/contraction of a bellows caused by reciprocal movements of a piston. In the bellows type chemical liquid supplying apparatus, a bellows is mounted between a connection rod provided at the tip of the piston and a cylinder, and in the bellows, that is, between the bellows and the piston, incompressible indirect medium is sealed. And when the bellows is expanded by a forward movement of the piston, the pump chamber is contracted, while when the bellows is contracted by a backward movement of the piston, the pump chamber is expanded.

In any of these type apparatuses, the chemical liquid discharged from the pump chamber is discharged from an application nozzle provided at the tip of an discharge side passage, and there are a direct operated type apparatus in which the pump chamber is directly expanded/contracted by the reciprocal movements of the piston or the expansion/contraction of the bellows, and an indirect operated type apparatus in which the pump chamber is indirectly expanded/contracted via an incompressible indirect medium. The indirect operated type chemical liquid supplying apparatus has an elastically deformable partition film which divides its internal space into the pump chamber and a driving chamber, and via the incompressible indirect medium sealed in the driving chamber formed as a compartment between the piston or the bellows and the partition film, the pump chamber is expanded/contracted by the reciprocal movements of the piston or the extension/contraction of the bellows.

PRIOR ART DOCUMENTS

Patent Documents

Patent Document 1: Japanese Patent Application Laid-Open Publication No. 2008-128059

Patent Document 2: Japanese Patent Application Laid-Open Publication No. 2009-138520

DISCLOSURE OF THE INVENTION

Problems to be Solved by the Invention

And, in order to form the fine circuit pattern on the surface of a wafer, a glass substrate, or the like, the chemical liquid supplying apparatus is required for discharging a specific amount of chemical liquid such as photoresist liquid with a high degree of accuracy. That is, it is necessary to correlate the stroke of the piston with the discharge amount of the chemical liquid with a high degree of accuracy, and to allow the stroke of the piston to have a linear relationship with the discharge amount of the chemical liquid.

However, when the chemical liquid is discharged from the pump chamber with high pressure, a resin tube forming an discharge side passage for guiding the chemical liquid discharged from the pump chamber to the application nozzle tends to be expanded in the radially-outward direction. Furthermore, when the pressure in the pump chamber is increased, the partition film and the bellows which are formed by elastically deformable members are elastically deformed so as to be reduced in thickness. For this reason, when the chemical liquid is discharged from the pump chamber with high pressure, it is impossible to correlate the amount of the chemical liquid discharged from the application nozzle fails with the stroke of the piston with a high degree of accuracy.

An object of the present invention is to discharge a specific amount of chemical liquid with a high degree of accuracy.

Means for Solving the Problems

A chemical liquid supplying apparatus according to the present invention has a pump chamber which sucks chemical liquid from a chemical liquid supply source at the time of expansion of the pump chamber, and discharges the chemical liquid to a chemical liquid discharge portion at the time of contraction of the pump chamber, and comprises: a cylinder in which a piston is accommodated and reciprocally movable in an axial direction thereof, wherein a connection rod is provided at a tip of the piston, and a pressure chamber in which an incompressible indirect medium is sealed is provided on a tip surface side of the piston; a bellows elastically deformable in an axial direction thereof and mounted between a tip of the connection rod and the cylinder, wherein an expanding/contracting chamber continuous from the pressure chamber is formed between the bellows and the connection rod, and the bellows has an average effective diameter which is set to be smaller than an outer diameter of the piston; and driving means for reciprocating the piston in the axial direction so that when the piston is moved in a forward direction, the bellows is expanded so as to contract the pump chamber, and when the piston is moved in a backward direction, the bellows is contracted so as to expand the pump chamber, wherein the average effective diameter of the bellows is increased by the incompressible indirect medium which flows into the expanding/contracting chamber from the pressure chamber with the forward movement of the piston.

The chemical liquid supplying apparatus according to the present invention further comprises a flexible cover member which is elastically deformable in the axial direction, and provided between a base end portion of the piston and the cylinder, the flexible cover member forming a seal chamber in which incompressible indirect medium is sealed.

In the chemical liquid supplying apparatus according to the present invention, the flexible cover member is a bellows which is used as a cover, the bellows having an average effective diameter which is set to be the same as the outer diameter of a sliding surface of the piston.

The chemical liquid supplying apparatus according to the present invention further comprises a partition film which is elastically deformable, and separates a driving chamber formed on the outside of the bellows from the pump chamber, the pump chamber being expanded/contracted via an incompressible indirect medium sealed in the driving chamber.

In the chemical liquid supplying apparatus according to the present invention, the pump chamber is formed as a compartment on the outside of the bellows, and the pump chamber is directly expanded/contracted by the extension and contraction of the bellows.

Effects of the Invention

In accordance with the present invention, since the outer diameter of the sliding surface of a piston is set to be larger than the average effective diameter of the bellows, and the average effective diameter of the bellows is expanded by an incompressible indirect medium which flows into the expanding/contracting chamber from the pressure chamber with an forward movement of the piston. Thus, when it is necessary to discharge the chemical liquid from the pump chamber with high pressure against the high flow resistance of the secondary flow passage, even if the tube forming the secondary flow passage is expanded in the radial direction by the pressure in the pump chamber and the like, or the bellows and the partition film are compressed, it is possible to correlate the stroke of the piston with the discharge amount of the chemical liquid with a high degree of accuracy. That is, by increasing the average effective diameter of the bellows with the forward movement of the piston, since the volume of the pump chamber is gradually reduced by the expanded inner volume, it is possible to cancel out the increment in inner volume of the secondary flow passage caused by the expansion in the radially-outward direction of the tube forming the secondary flow passage, and the increment in inner volume of the pump chamber caused by the compression of the bellows and the partition film can be cancelled with each other. Therefore, the pump chamber can be contracted by the inner volume change depending on the stroke of the piston, and it is possible to discharge a specific amount of chemical liquid with a high degree of accuracy.

BRIEF DESCRIPTIONS OF THE DRAWINGS

BEST MODE FOR CARRYING OUT THE INVENTION

Figure 1:
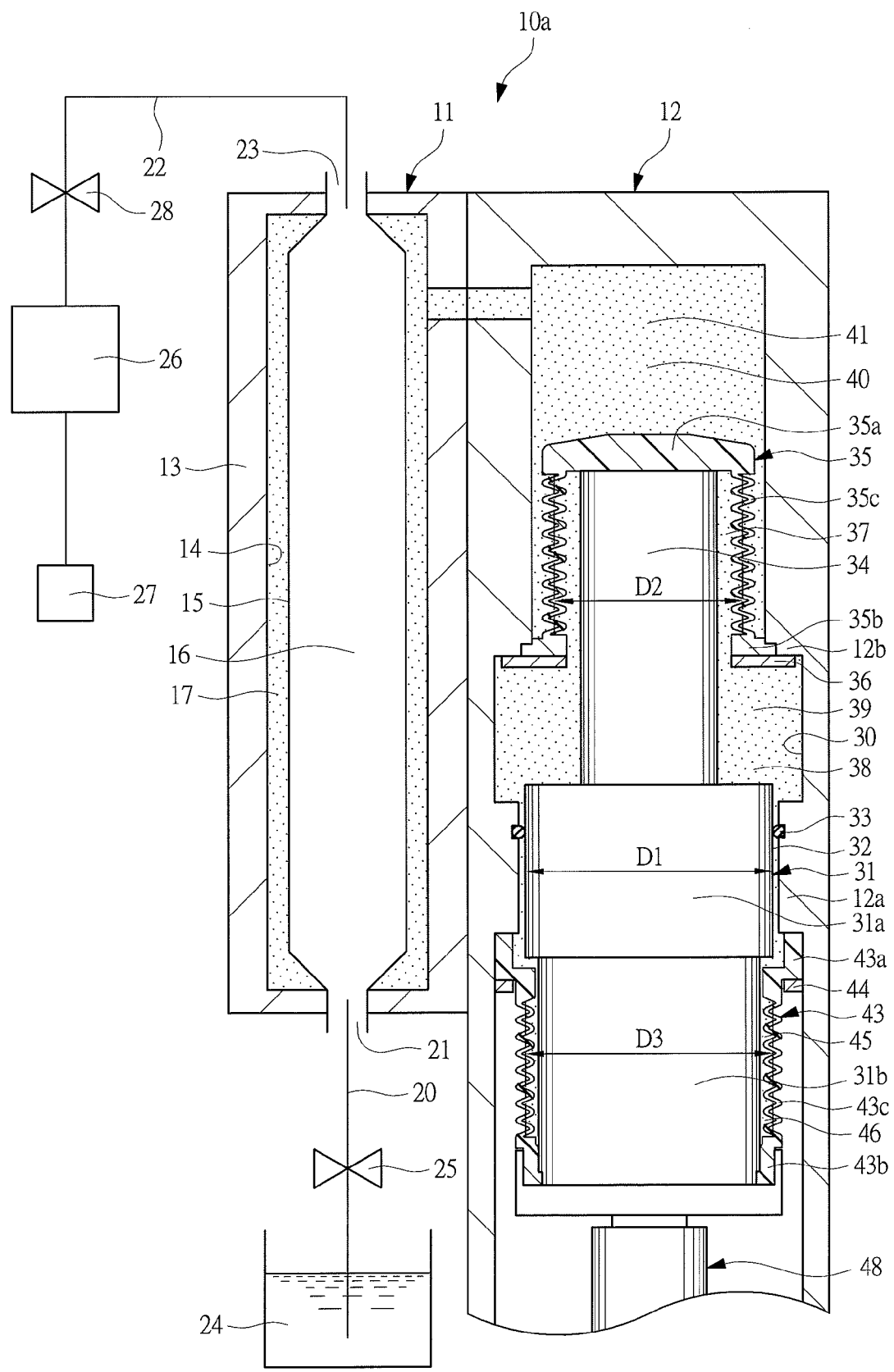
FIG. 1 is a cross-sectional view showing part of a chemical liquid supplying apparatus according to one embodiment of the present invention.

Hereinafter, embodiments of the present invention will be described in detail with reference to the drawings. A chemical liquid supplying apparatus 10a shown in FIG. 1 is used for applying chemical liquid such as photoresist liquid onto a surface of, for example, a semiconductor wafer, a liquid crystal glass substrate, or the like, and provided with a pump 11 and a cylinder 12. The pump 11 is provided with a pump case 13 which is secured to the cylinder 12, and a flexible tube 15 which is mounted to a cylindrical space 14 in the pump case 13. The flexible tube 15 is formed by an elastic member which is able to expand and contract in the radial direction, and by this flexible tube 15 serving as a partition film, the space 14 is divided into a pump chamber 16 on the inside thereof and a pump side driving chamber 17 on the outside thereof.

The flexible tube 15 is made of tetrafluoroethylene perfluoroalkylvinyl ether copolymer (hereinafter simply referred to as "PFA"), and the flexible tube made of PFA does not react with photoresist liquid. However, depending on the types of the chemical liquid, the material for the flexible tube 15 is not limited to PFA, and other resin materials which are elastically deformable or flexible materials such as rubber materials may be used.

A chemical liquid inlet 21 which communicates with a supply side passage 20 and a chemical liquid outlet 23 which communicates with a discharge side passage 22 are formed on respective ends of the flexible tube 15. The supply side passage 20 is connected to a chemical liquid tank 24 serving as a chemical liquid supply source in which chemical liquid such as resist liquid is accommodated, and a supply side opening/closing valve 25 for opening and closing the passage is formed on the supply side passage 20. The discharge side passage 22 is connected to an application nozzle 27 serving as a chemical liquid discharge portion via a filter 26, and a discharge side opening/closing valve 28 for opening and closing the passage is formed on the discharge side passage 22. The supply side passage 20 and the discharge side passage 22 are formed by tubes made of resin or the like. As the respective opening/closing valves 25 and 28, solenoid valves operated by electric signals, motor-driven valves, air operating valves operated by air pressure, and the like may be used. Furthermore, non-return valves allow the chemical liquid to flow from the chemical liquid tank 24 to the pump chamber 16 and to flow from the pump chamber 16 to the application nozzle 27, and prevent the chemical liquid from flowing in the reverse direction, that is, check valves, may be respectively used for them.

In a cylinder hole 30 formed in the bottomed cylinder 12, a piston 31 is accommodated and reciprocally movable in the axial direction, and the piston 31 has a piston main body portion 31a and a base end 31b having a diameter smaller than that of this main body portion. A sliding wall portion 12a which protrudes in the radially-inward direction from the inner circumferential surface of the cylinder hole 30 is formed in the cylinder 12, and the piston main body portion 31a is provided with a sliding surface 32 which comes in sliding contact with the inner circumferential surface of the sliding wall portion 12a, that is, the cylinder hole 30. A connection rod 34 having a column shape extending coaxially with the piston 31 is formed on the tip of the piston 31, and the connection rod 34 is formed so as to have a diameter smaller than an outer diameter D1 of the sliding surface 32 of the piston 31. This connection rod 34 may be integrally formed with the piston 31, or a connection rod 34, formed as a separate portion, may be mounted to the tip of the piston 31.

In order to seal a gap between the sliding surface 32 of the piston main body portion 31a and the inner circumferential surface of the sliding wall portion 12a, a sealing member 33 is mounted to a ring-shaped groove formed on the inner circumferential surface of the sliding wall portion 12a, and the sealing member 33 is held in sliding contact with the sliding surface 32 of the piston main body portion 31a. Additionally, a ring-shaped groove may be formed on the sliding surface 32 of the piston main body portion 31a, and the sealing member 33 may be mounted to the ring-shaped groove, and in this case, the sealing member 33 is held in sliding contact with the inner circumferential surface of the sliding wall portion 12a. As the sealing member 33, an O-ring having a circular shape in cross section is used; however, other sealing members may be used.

In the cylinder hole 30, a bellows 35 is provided on the tip side, and close to the tip side in comparison with the piston 31. The bellows 35 is provided with a disc portion 35a on the tip side, an annular portion 35b on the base end side, and a bellows portion 35c which is elastically deformable between these portions in the axial direction. In the bellows 35, since the disc portion 35a is secured to the tip of the connection rod 34, and the annular portion 35b is tightly secured between a step portion 12b of the cylinder 12 and a snap ring 36, the bellows 35 is mounted between the tip of the connection rod 34 and the cylinder 12. In other word, the bellows portion 35c of the bellows 35 is expanded in the axial direction so as to surround the outer circumference of the connection rod 34 with a predetermined gap. In this way, by securing the disc portion 35a of the bellows 35 to the tip of the connection rod 34, the stroke of the piston 31 and the expanding/contracting stroke of the bellows 35 are brought precisely in line with each other. The bellows portion 35c of the bellows 35 has "V" shaped inside surface portions and outside surface portions, is formed into a zig-zag shape, and varied in diameter along the axial direction. Supposing that the average effective diameter of the entire bellows portion 35c is D2, the average effective diameter D2 of the bellows portion 35c is set so as to be smaller than the outer diameter D1 of the sliding surface 32 of the piston 31 (D1>D2).

In the bellows 35, an expanding/contracting chamber 37 is formed as a compartment between the bellows 35 and the connection rod 34, and a pressure chamber 38 which communicates with the expanding/contracting chamber 37 is provided on the tip side of the piston 31. An incompressible indirect medium 39 composed of liquid such as oil is enclosed in the expanding/contracting chamber 37 and the pressure chamber 38. On the other hand, on the outside of the bellows 35, a cylinder side driving chamber 40 which communicates with the pump side driving chamber 17 is formed as a compartment, and an incompressible indirect medium 41 composed of liquid such as oil is enclosed in the pump side driving chamber 17 and the cylinder side driving chamber 40. Additionally, the indirect medium 41 to be enclosed in the pump side driving chamber 17 and cylinder side driving chamber 40 is the same in type as the indirect medium 39 to be enclosed in the expanding/contracting chamber 37 and the pressure chamber 38; however, different types of liquids may be used as the indirect medium 39 and the indirect medium 41. Furthermore, in order to prevent the indirect medium 41 from leaking from a joined portion between the pump side driving chamber 17 and the cylinder side driving chamber 40, a sealing member (not shown) is mounted to a gap between the pump case 13 and the cylinder 12. In this case, the pump side driving chamber 17 and the cylinder side driving chamber 40 may be allowed to communicate with each other via a hose or a tube, and the pump case 13 and the cylinder 12 may be formed by using an integral member.

In the cylinder hole 30, a cover-use bellows 43 as a flexible cover member is provided on the base end side, and close to the base end side in comparison with the piston 31. The bellows 43 is provided with an annular tip portion 43a, a base end portion 43b, a bellows portion 43c which is elastically deformable in the axial direction between these portions. Since the tip portion 43a is secured between the sliding wall portion 12a of the cylinder 12 and a snap ring 44, and the base end portion 43b of the bellows 43 is tightly secured to the base end portion 31 b of the piston 31, the bellows 43 is mounted between the base end portion 31b of the piston 31 and the cylinder 12. In other word, the bellows portion 43c of the bellows 43 is expanded in the axial direction so as to surround the outer circumference of the base end portion 31b of the piston 31 with a predetermined gap. The bellows portion 43c of the bellows 43 has "V" shaped inside surface portions and outside surface portions, is formed into a zig-zag shape, and varied in diameter along the axial direction. Supposing that the average effective diameter of the entire bellows portion 43c is D3, the average effective diameter D3 of the bellows portion 43c is set so as to be substantially the same as the outer diameter D1 of the sliding surface 32 of the piston 31 (D1=D3).

On the inside of the bellows 43, a seal chamber 45 continuous from the piston 31 is formed as a compartment between the bellows 43 and the piston 31, and an incompressible indirect medium 46 is enclosed in the seal chamber 45. Additionally, the indirect medium 46 to be enclosed in the seal chamber 45 is the same in type as the indirect medium 39 to be enclosed in the expanding/contracting chamber 37 and the pressure chamber 38; however, may be different in type from the indirect medium 39 and the indirect medium 46.

To the base end portion 31b of the piston 31, driving means 48 which reciprocates the piston 31 in the axial directions is connected. A ball screw mechanism which is driven in the axial directions by the rotation of an electric motor is used as the driving means 48, and by controlling the rotation direction and the revolution number of the electric motor, the piston 31 is reciprocally moved in the axial directions at a predetermined stroke. The driving means 48 is not limited to the ball screw mechanism, and other driving means such as linear motor and pneumatic cylinder may be used.

In the bellows type chemical liquid supplying apparatus 10a provided with the bellows 35 in this manner, since vibrations transmitted from the driving means 48 to the piston 31 and vibrations generated in the sliding portion between the piston 31 and the sealing member 33 are attenuated by the bellows 35, the influence of vibrations of the piston 31 on the discharge of the chemical liquid is small. Therefore, it is possible to prevent the vibrations of the piston 31 from being transmitted to the chemical liquid flowing in the pump chamber 16, and deteriorating the pump characteristics.

When the piston 31 is moved forward in a direction toward the bellows 35, since the disc portion 35a of the bellows 35 connected to the connection rod 34 is moved forward with the piston 31, the bellows portion 35c of the bellows 35 is expanded in the axial direction. When the cylinder side driving chamber 40 is contracted by the extension of the bellows 35, since the indirect medium 41 in the cylinder side driving chamber 40 is allowed to flow into the pump side driving chamber 17 so that the pump side driving chamber 17 is expanded, the flexible tube 15 is contracted in the radial direction, and the pump chamber 16 is contracted. By the contraction of the pump chamber 16, the chemical liquid in the pump chamber 16 is discharged toward the application nozzle 27 via the discharge side passage 22, and the chemical liquid is applied onto an object to be coated, such as a semiconductor wafer.

At the time of this forward movement of the piston 31, since the outer diameter D1 of the sliding surface 32 of the piston 31 is set to be larger than the average effective diameter D2 of the bellows 35, the average effective diameter D2 of the bellows 35 is expanded by the forward movement of the piston 31. In other words, since the outer diameter D1 of the sliding surface 32 is set to be larger than the average effective diameter D2 of the bellows 35, the amount of the indirect medium 39 which slips into the expanding/contracting chamber 37 from the pressure chamber 38 becomes larger than the increment in inner volume of the expanding/contracting chamber 37 which is increased by the extension of the bellows 35. For this reason, when the bellows 35 is expanded in the axial direction by the forward movement of the piston 31, the bellows portion 35c is expanded in the radially-outward direction by the indirect medium 39 which flows into the expanding/contracting chamber 37. Thus, in the case where it is necessary to discharge the chemical liquid at a high pressure from the pump chamber 16 against the high passage resistance of the discharge side passage 22, even if the resin tube forming the discharge side passage 22 is expanded in the radially-outward direction by that pressure, or the flexible tube 15 and the bellows 35 are compressed by that pressure, the stroke of the piston 31 and the discharge amount of the chemical liquid can be brought in line with each other with a high degree of accuracy.

That is, at the time of discharging the chemical liquid from the pump chamber 16 at a high pressure, with increasing pressure of the pump chamber 16 by the forward movement of the piston 31, the resin tube forming the discharge side passage 22 is gradually expanded in the radially-outward direction by the pressure in the discharge side passage 22, so that the volume of the discharge side passage 22 becomes larger. Furthermore, when the pressure in the pump chamber 16, the driving chambers 17 and 39, and the pressure chamber 37 is increased by the forward movement of the piston 31, the flexible tube 15 and the bellows 35 are gradually flexibly deformed so as to be reduced in thickness so that the volume of the pump chamber 16 becomes larger by the compressed volume. For this reason, in the case where the outer diameter D1 of the sliding surface 32 of the piston 31 and the average effective diameter D2 of the bellows 35 are set to the same diameter, the amount of the chemical liquid discharged from the application nozzle 27 is reduced by increase in the inner volume of the discharge side passage 22 and the pump chamber 16, so the amount of the chemical liquid to be discharged fails to be correlated with the stroke of the piston 31 with a high degree of accuracy.

In contrast, in this chemical liquid supplying apparatus 10a, by increasing the average effective diameter D2 of the bellows 35 with the forward movement of the piston 31, the inner volume of the pump chamber 16 is gradually reduced by the expanded inner volume, the increment in inner volume of the discharge side passage 22 caused by the expansion of the tube and the increment in inner volume of the pump chamber 16 caused by the compression of the flexible tube 15 and the bellows 35 can be cancelled with each other as a whole. Therefore, the pump chamber 16 can be contracted by the inner volume change related to the forward movement stroke of the piston 31, so that a specific amount discharging process of the chemical liquid can be carried out with a high degree of accuracy.

When the piston 31 is moved backward in a direction toward the bellows 43, since the disc portion 35a of the bellows 35 connected to the connection rod 34 is moved backward with the piston 31, the bellows portion 35c of the bellows 35 is contracted in the axial direction. When the cylinder side driving chamber 40 is expanded by the contraction of the bellows 35, since the indirect medium 41 in the pump side driving chamber 17 is allowed to flow into the cylinder side driving chamber 40 so that the pump side driving chamber 17 is contracted, the flexible tube 15 is expanded in the radial direction, and the pump chamber 16 is expanded. By the expansion of the pump chamber 16, the chemical liquid is sucked into the pump chamber 16 from the chemical liquid tank 24 via the supply side passage 20.

At the time of this backward movement of the piston 31, since the outer diameter D1 of the sliding surface 32 of the piston 31 is set to be larger than the average effective diameter D2 of the bellows 35, the average effective diameter D2 of the bellows 35 is contracted by the backward movement of the piston 31. In other words, since the outer diameter D1 of the sliding surface 32 is set to be larger than the average effective diameter D2 of the bellows 35, the amount of the indirect medium 39 which slips into the pressure chamber 38 from the expanding/contracting chamber 37 becomes larger than the increment in inner volume of the pressure chamber 38 which is increased by the contraction of the bellows 35. For this reason, when the bellows 35 is contracted in the axial direction by the backward movement of the piston 31, the expansion of the bellows portion 35c caused by the indirect medium 39 is reduced, and the bellows portion 35c is contracted in the radially-inward direction. Thus, since the inner volume of the pump chamber 16 is gradually increased by the reduced inner volume, the decrement in inner volume of the discharge side passage 22 caused by the contraction of the resin tube in the radial direction with the forward movement of the piston 31, the resin tube forming the discharge side passage 22, and the reduction in inner volume of the pump chamber 16 caused by the elastic deformation of the flexible tube 15 and the bellows 35 so as to reduce its thickness (so as to reduce the amount of contraction) can be cancelled with each other as a whole. Therefore, the pump chamber 16 can be expanded by the amount of volume change in accordance with the backward movement stroke of the piston 31.

In the cover-use bellows 43, when the piston 31 is moved in the forward direction, the bellows portion 43c is contracted in the axial direction, while when the piston 31 is moved in the backward direction, the bellows portion 43c is expanded in the axial direction. Since the average effective diameter D3 of the bellows 43 is set to be substantially the same as the outer diameter D1 of the sliding surface 32 of the piston 31, the bellows portion 35c of the bellows 35 is deformed only in the axial direction when the bellows 43 is expanded/contracted in the axial direction by the reciprocal movement of the piston 31 in the axial direction, and is not deformed in the radial direction. That is, in the case when the piston 31 is moved in the forward direction (or moved in the backward direction), since the change in inner volume of the seal chamber 45 due to the contraction (or extension) in the axial direction of the bellows 43 is substantially equal to the change in inner volume of the seal chamber 45 due to the forward movement (or backward movement) of the piston 31, the bellows portion 43c is not expanded or contracted in the radial direction by the indirect medium 46 sealed in the seal chamber 45.

By providing the cover-use bellows 43 to form the seal chamber 45 as a compartment, even if the indirect medium 39 adhered to the sliding surface 32 is leaked from the gap between the sealing member 33 and the sliding surface 32 by a pressure of the pressure chamber 38 at the time of reciprocal movements of the piston 31, the indirect medium 39 leaked from the pressure chamber 38 can be taken into the indirect medium 46 in the seal chamber 45. Thus, it is possible to prevent the indirect medium 39 leaked from the gap between the sliding surface 32 of the piston 31 and the sealing member 33 from scattering externally.

Furthermore, even if the indirect medium 46 leaked from the seal chamber 45 enters the pressure chamber 38 through the gap between the sealing member 33 and the sliding surface 32 at the time of reciprocal movements of the piston 31, it is possible to prevent outside air from leaking into the pressure chamber 38. And since the indirect medium 46 such as liquid is larger in molecular weight than gas, this medium is hardly allowed to pass through a fine gap between the sealing member 33 and the siding surface 32, so that the amount of the indirect medium 46 which enters the pressure chamber 38 from the seal chamber 45 is small. In this way, by preventing outside air from leaking into the pressure chamber 38, it is possible to properly maintain incompressibility in the pressure chamber 38, and the discharge precision of the chemical liquid can be maintained in a high level for a long period of time.

Furthermore, since with the sealing member 33 sealing the gap between the sliding surface 32 of the piston 31 and the inner circumferential surface of the sliding wall portion 12a serving as a boundary, and the incompressible indirect media 39 and 46 are filled on the respective sides of this member in the axial direction, the thin film of indirect media 39 and 46 intervenes between the sealing member 33 and the sliding surface 32. Thus, the lubricating property of the sealing member 33 is enhanced so as to prevent abrasion of the sealing member 33, thereby improving the durability of the sealing member 33 and the service life of the chemical liquid supplying apparatus 10a.

Figure 2:
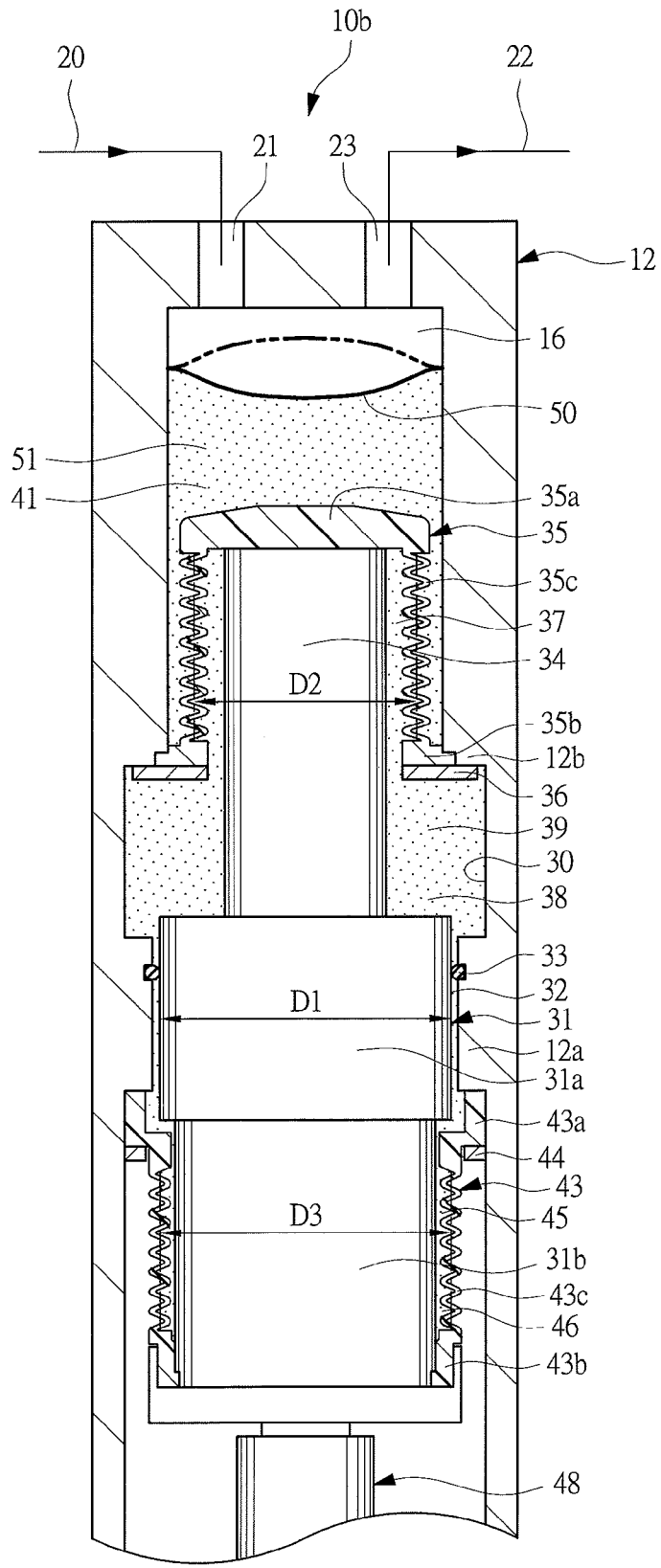
FIG. 2 is a cross-sectional view showing part of a chemical liquid supplying apparatus according to another embodiment of the present invention.
Figure 3:
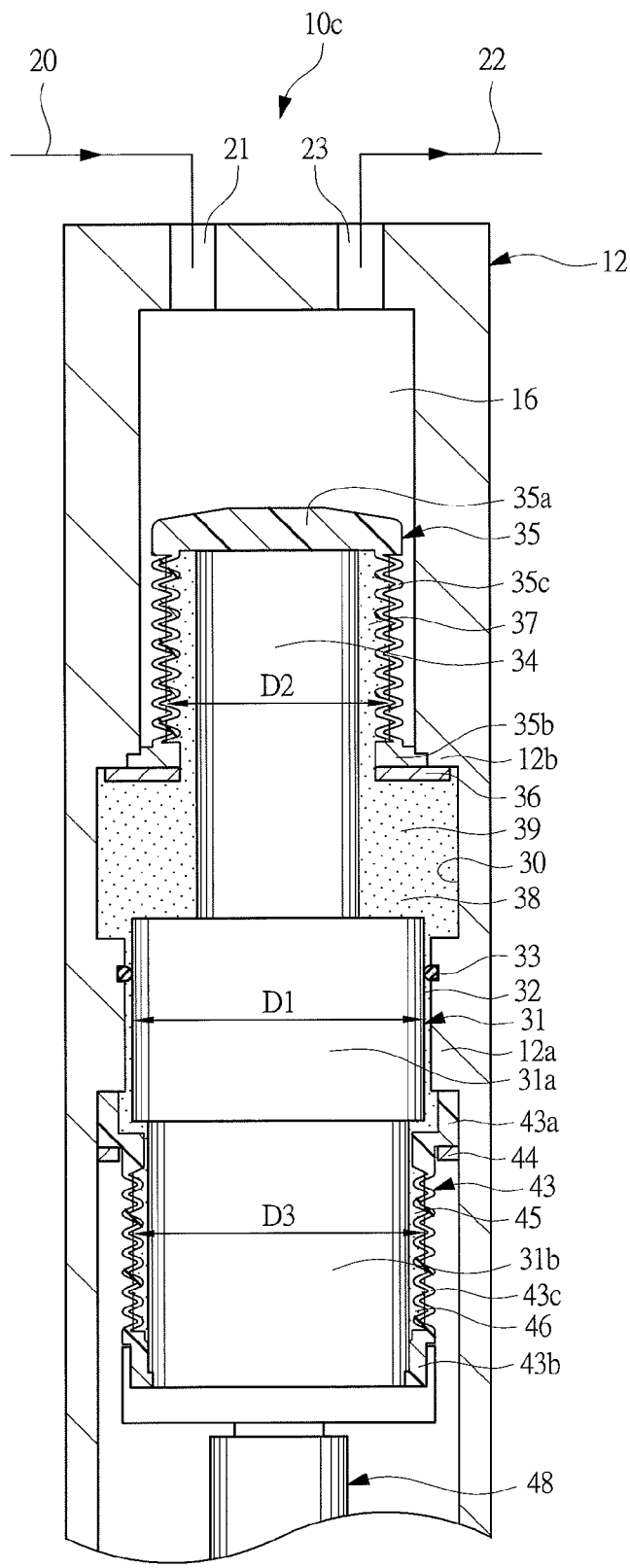
FIG. 3 is a cross-sectional view showing part of a chemical liquid supplying apparatus according to still another embodiment of the present invention.

Each of FIGS. 2 and 3 is a cross-sectional view showing part of a chemical liquid supplying apparatus according to another embodiment of the present invention. Additionally, members the same as those in the above embodiment are denoted by the same reference numbers and the detail descriptions thereof are omitted here.

In the same manner as the chemical liquid supplying apparatus 10a shown in FIG. 1, a chemical liquid supplying apparatus 10b shown in FIG. 2 is an indirect operated apparatus in which the pump chamber 16 is indirectly expanded/contracted by the expansion/contraction of the bellows 35 via the indirect medium 41 sealed in the driving chamber 51. This chemical liquid supplying apparatus 10b is provided with a diaphragm 50 which is elastically deformable in the axial direction in the cylinder hole 30, and located on the tip side in comparison with the bellows 35. The diaphragm 50 serving as a partition film is formed by a material such as PFA which does not react with photoresist liquid. However, depending on the type of the chemical liquid, the material for the diaphragm 50 is not limited to PFA, and other resin materials which are elastically deformable, or flexible materials such as rubber materials may be used.

On the base end side of the diaphragm 50, the driving chamber 51 is formed between the diaphragm 50 and the bellows 35, and an incompressible indirect medium 41 made of liquid such as oil is sealed in the driving chamber 51. In other words, the driving chamber 51 is used as both the above-mentioned pump side driving chamber 17 and the cylinder side driving chamber 40. On the other hand, on the tip side of the diaphragm 50, a pump chamber 16 which communicates with the chemical liquid inlet 21 and the chemical liquid outlet 23 is formed as a compartment. Additionally, the diaphragm 50 is provided in the cylinder hole 30 in this case; however, a pump 11 provided with the diaphragm 50 in place of the flexible tube 15 may be mounted to the cylinder 12.

A chemical liquid supplying apparatus 10c shown in FIG. 3 is a direct operated apparatus in which the pump chamber 16 is directly expanded/contracted by the expansion/contraction of the bellows 35, and a pump chamber 16 which communicates with the chemical liquid inlet 21 and the chemical liquid outlet 23 is formed as a compartment on the outside of bellows 35. In this case, the bellows 35 is made of material such as PFA which does not react with photoresist liquid. However, depending on the type of the chemical liquid, the material for the bellows 35 is not limited to PFA, and other resin materials which are elastically deformable, or flexible materials such as rubber material may be used.

In these chemical liquid supplying apparatuses 10b and 10c as well, the outer diameter D1 of the sliding surface 32 of the piston 31 is set to be larger than the average effective diameter D2 of the bellows 35, and the same effects as those of the chemical liquid supplying apparatus 10a shown in FIG. 1 can be obtained.

It is needless to say that the invention is not limited to the above embodiments, but that various changes may be made within the scope not departing from the gist of the invention. For example, in the above embodiment, each of the bellows 35 and 43 has inside portions and outside portions, each of which has a "V" shape in cross section; however, each cross sectional shape of the inside portions and outside portions is not intended to be limited by the "V" shape in cross section. Furthermore, as the flexible cover member for forming the seal chamber 45 as a compartment, the bellows 43 is used; however, other flexible members such as diaphragm and the like may be used.

INDUSTRIAL APPLICABILITY

The present invention is used for applying chemical liquid such as photoresist liquid or the like to the surface of a semiconductor wafer, a liquid crystal glass substrate, or the like.

What is claimed is:

1. A chemical liquid supplying apparatus having a pump chamber which sucks chemical liquid from a chemical liquid supply source at the time of expansion of the pump chamber, and discharges the chemical liquid to a chemical liquid discharge unit at the time of contraction of the pump chamber, comprising:
    a cylinder in which a piston is accommodated and reciprocally movable in an axial direction thereof, wherein the piston has a sliding surface that is in sliding contact with an inner surface of the cylinder, a connection rod is provided at a tip of the piston, and a pressure chamber in which an incompressible indirect medium is sealed is provided on a tip surface side of the piston;
    a bellows elastically deformable in the axial direction thereof and mounted between a tip of the connection rod and the cylinder, wherein an expanding/contracting chamber continuous from the pressure chamber is formed between the bellows and the connection rod, and an outer diameter of the sliding surface of the piston is larger than an average effective diameter of the bellows;
    driving means that are mechanically connected with the piston and configured to reciprocate the piston in the axial direction, wherein when the piston is moved in a forward direction, the bellows is expanded so as to contract the pump chamber, and when the piston is moved in a backward direction, the bellows is contracted so as to expand the pump chamber; and
    a sealing member for sealing any gap between the sliding surface of the piston and the inner surface of the cylinder, wherein the average effective diameter of the bellows is increased by the incompressible indirect medium which flows into the expanding/contracting chamber from the pressure chamber with the forward movement of the piston.

2. The chemical liquid supplying apparatus according to claim 1, further comprising a flexible cover member which is elastically deformable in the axial direction, and provided between a base end portion of the piston and the cylinder, the flexible cover member forming a seal chamber in which incompressible indirect medium is sealed.

3. The chemical liquid supplying apparatus according to claim 2, wherein the flexible cover member is a second bellows which is used as a cover, the second bellows having an average effective diameter which is set to be the same as the outer diameter of the sliding surface of the piston.

4. The chemical liquid supplying apparatus according to claim 1, further comprising a partition film which is elastically deformable, and separates a driving chamber formed on the outside of the bellows from the pump chamber, the pump chamber being expanded/contracted via an incompressible indirect medium sealed in the driving chamber.

5. The chemical liquid supplying apparatus according to claim 1, wherein the pump chamber is formed as a compartment on the outside of the bellows, and the pump chamber is directly expanded/contracted by the extension and contraction of the bellows.

6. The chemical liquid supplying apparatus according to claim 2, further comprising a partition film which is elastically deformable, and separates a driving chamber formed on the outside of the bellows from the pump chamber, the pump chamber being expanded/contracted via an incompressible indirect medium sealed in the driving chamber.

7. The chemical liquid supplying apparatus according to claim 2, wherein the pump chamber is formed as a compartment on the outside of the bellows, and the pump chamber is directly expanded/contracted by the extension and contraction of the bellows.

8. The chemical liquid supplying apparatus according to claim 3, further comprising a partition film which is elastically deformable, and separates a driving chamber formed on the outside of the second bellows from the pump chamber, the pump chamber being expanded/contracted via an incompressible indirect medium sealed in the driving chamber.

9. The chemical liquid supplying apparatus according to claim 3, wherein the pump chamber is formed as a compartment on the outside of the second bellows, and the pump chamber is directly expanded/contracted by the extension and contraction of the second bellows.

* * * * *